(12) United States Patent
Ingalz

(10) Patent No.: US 9,968,008 B2
(45) Date of Patent: May 8, 2018

(54) METHOD OF IMPROVING EFFICIENCY OF FAN IN INFORMATION TECHNOLOGY HARDWARE

(71) Applicant: Baidu USA LLC, Sunnyvale, CA (US)

(72) Inventor: Charles Ingalz, Los Gatos, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days. days.

(21) Appl. No.: 15/162,519

(22) Filed: May 23, 2016

(65) Prior Publication Data

US 2017/0339804 A1 Nov. 23, 2017

(51) Int. Cl.
*H05K 7/20* (2006.01)
*H02M 1/42* (2007.01)
*H02P 7/06* (2006.01)

(52) U.S. Cl.
CPC ...... *H05K 7/20736* (2013.01); *H02M 1/4208* (2013.01); *H02P 7/06* (2013.01)

(58) Field of Classification Search
CPC .................................................. H02M 1/4208
See application file for complete search history.

(56) References Cited

U.S. PATENT DOCUMENTS

| | | | | |
|---|---|---|---|---|
| 4,765,618 A * | 8/1988 | Daley | ................... | A63B 69/406 124/1 |
| 4,773,586 A * | 9/1988 | Ryan | ..................... | F24H 9/2085 236/11 |
| 4,937,730 A * | 6/1990 | Marcie | ..................... | H02M 5/12 174/67 |
| 4,971,049 A * | 11/1990 | Rotariu | ................. | A61M 16/00 128/204.21 |
| 5,600,549 A * | 2/1997 | Cross | ................... | H02M 1/4208 323/285 |
| 6,188,187 B1 * | 2/2001 | Harlan | ..................... | H02P 6/08 318/400.04 |
| 6,285,146 B1 * | 9/2001 | Harlan | ..................... | H02P 6/08 318/400.04 |
| 6,650,072 B2 * | 11/2003 | Harlan | ..................... | H02P 6/08 318/400.2 |
| 6,762,577 B2 * | 7/2004 | Gray | ...................... | F25D 17/06 318/268 |
| 6,878,099 B2 * | 4/2005 | Corbalis | ................ | A63B 22/02 482/54 |

(Continued)

*Primary Examiner* — Robert J Hoffberg
(74) *Attorney, Agent, or Firm* — Womble Bond Dickinson (US) LLP

(57) ABSTRACT

An electronic rack includes a plurality of information technology (IT) components arranged in a stack, and a rack power supply having a voltage converter and a voltage regulator. The rack power supply to receive an input voltage from a power source, where the voltage converter is to convert the input voltage into an intermediate voltage, where the voltage regulator is to regulate the intermediate voltage to generate a regulated voltage to be supplied to the plurality of the IT components. Each electronic rack includes a fan system having one or more fan units coupled to the rack power supply to provide cooling air to reduce an operating temperature of the IT components, where each of the fan units is to receive the intermediate voltage without going through the voltage regulator and to provide power to a fan of the fan unit.

20 Claims, 5 Drawing Sheets

(56) References Cited

U.S. PATENT DOCUMENTS

| | | | | |
|---|---|---|---|---|
| 7,086,995 B2* | 8/2006 | Reyes | ................... | A63B 22/02 |
| | | | | 482/1 |
| 7,179,202 B2* | 2/2007 | Marin | ................ | A63B 22/0242 |
| | | | | 482/54 |
| 7,481,744 B2* | 1/2009 | Reyes | ................... | A63B 22/02 |
| | | | | 482/1 |
| 7,583,043 B2* | 9/2009 | Chung | ............... | G05D 23/1917 |
| | | | | 318/471 |
| 7,618,345 B2* | 11/2009 | Corbalis | ............... | A63B 22/00 |
| | | | | 482/1 |
| 8,508,154 B2* | 8/2013 | Chou | ................. | H02M 1/4225 |
| | | | | 315/291 |
| 9,071,161 B2* | 6/2015 | Lin | .................... | H02M 1/4258 |
| 9,130,472 B2* | 9/2015 | Lin | ........................ | H02M 1/42 |

\* cited by examiner

US 9,968,008 B2

METHOD OF IMPROVING EFFICIENCY OF FAN IN INFORMATION TECHNOLOGY HARDWARE

FIELD OF THE INVENTION

Embodiments of the present invention relate generally to electronic racks of data centers. More particularly, embodiments of the invention relate to improving efficiency of a fan for cooling an electronic rack of information technology (IT) components.

BACKGROUND

Heat removal is a prominent factor in computer system and data center design. The number of information technology (IT) components such as servers deployed within a data center has steadily increased as the server performance has improved, thereby increasing the amount of heat generated during the ordinary operation of the servers. The reliability of servers used within a data center decreases if the environment in which they operate is permitted to increase in temperature over time. A significant portion of the data center's power is used for cooling electronics at the server level. As the number of servers within a data center increases, a greater portion of the power is commensurately consumed by the data center to cool electronic components within the servers. This data center increase also increases the power and associated cost for data center operations.

Fans are extensively utilized to cool modern IT equipment and utilize up to ten percent of the total electrical power of the IT equipment. Improvements to efficiency of a fan and the fan's operations will directly impact the performance and operating cost of IT equipment. The efficiency of the fan is affected by many factors, such as an electrical loss from an electrical source to a fan, an internal electrical loss within the fan, and a mechanical loss within the fan. Conventionally in data center structures, improvements to fan efficiency is accomplished by IT cooling fans that have improvements within the fan. For example, three phase fan motors improve electrical efficiency and have become more readily available. Mechanical and aerodynamic refinements have also improved mechanical efficiency.

However, such configurations may improve the efficiency of the fan itself, but there remains opportunity to improve the electrical conversion and power distribution to fans of electronic racks located at the data centers. Further, such configurations are cost inefficient and not flexible.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
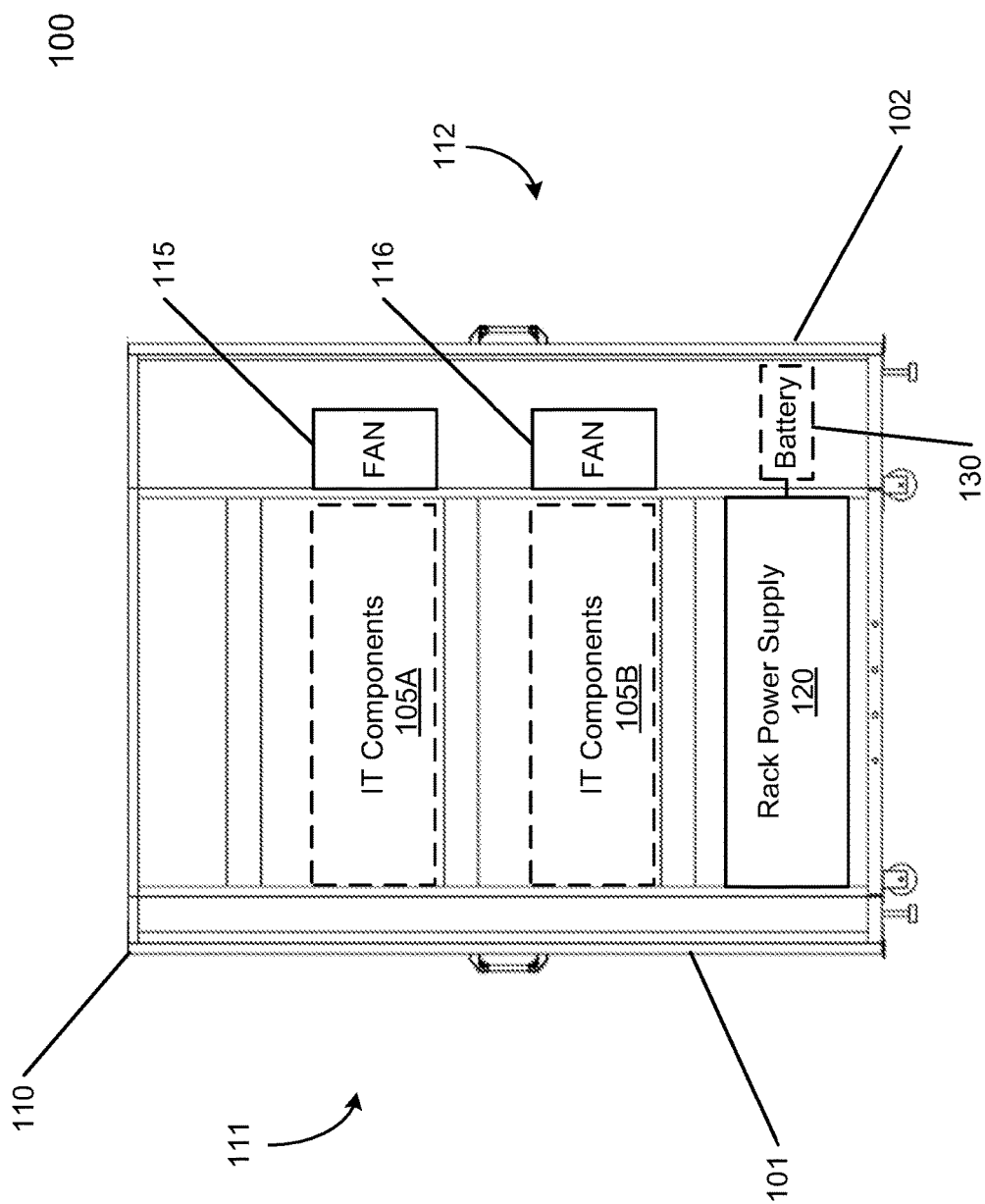
FIG. 1 is a block diagram illustrating an electronic rack that may be used in a data center system according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, an improved fan system is utilized to provide cooling air to reduce operating temperature of IT components in a data center system. The data center system, also referred to as a data center unit, may include an array of one or more data center systems. The electronic rack includes, but is not limited to, multiple IT components arranged in a stack, a power supply, and a fan system. The power supply includes at least one of a voltage converter and a voltage regulator. In one embodiment, the power supply receives an input voltage from a power source, and the voltage converter of the power supply converts the input voltage into an intermediate voltage. The voltage regulator regulates the intermediate voltage to generate a first regulated voltage, where the first regulated voltage is supplied to the plurality of the IT components.

In one embodiment, the fan system includes one or more fan units coupled to the power supply to provide cooling air to reduce operating temperature of the IT components. Each of the fan units may include a fan controller that receives the intermediate voltage without going through the voltage regulator of the power supply and thus provides power to a fan of the fan unit. Accordingly, the electrical power distribution within the electronic rack of the IT components is modified by bypassing the DC regulation stage of the power supply (i.e., the voltage regulator), and directing the intermediate voltage from the voltage converter to the electrical input to the fan system. For example, this electronic rack modification removes the power loss introduced from the regulating circuitry of the power supply without impacting the efficiency of the fan system. As such, the net result of electronic rack modification is gain in electrical efficiency of the power delivered to the fan system.

In one embodiment, the power supply of the electronic rack includes one or more power supplies. Each power supply includes a voltage converter to generate an intermediate voltage from an input voltage. Due to intermediate voltage bypassing the voltage regulator of the power supply, the intermediate voltage is a non-regulated voltage. In one embodiment, the fan system includes a fan unit, a fan controller, and a fan coil. The fan unit provides cool air to the IT components of the electronic racks. The fan controller receives the intermediate voltage (e.g., the non-regulated voltage) from the voltage converter of the power supply and provides an output power command to the fan unit. The fan coil is disposed within the fan unit. The fan coil receives the output power command of the fan controller and generates cool air directed into the housing of the IT components. Note that the fan system may include one or more fan coils, where each fan unit is associated with one fan coil.

In one embodiment, the output power command from the fan controller is a pulse-width modulated (PWM) signal. The fan system may be driven by a PWM controller. According to one embodiment, to adjust the speed of the fan coil of the fan system, the fan controller provides the PWM controller with a pulse width value that is associated with the output power command that is being supplied to the fan coil. The electronic rack may also include a host that sends an input signal to the PWM controller. The PWM controller receives the input signal and generates an input PWM signal. Accordingly, the fan controller receives the input PWM signal from the PWM controller and adjusts the output power command to the fan unit based on the input PWM signal. The output power command of the fan controller may be based on, but not limited to, a target speed setting, a measured rotation speed, and a supplied voltage.

FIG. 1 is a block diagram illustrating an electronic rack which may be used in a data center system according to one embodiment of the invention. In this example, FIG. 1 illustrates a side or cross view of the electronic rack. As used herein, the terms "electronic rack," "electronic rack unit," "rack-mounted electronic equipment," and "rack unit" are used interchangeably, and unless otherwise specified include any housing, frame, rack, compartment, blade server system, etc., having one or more heat generating IT components of a computer system or electronics system. In one embodiment, an electronic rack may include multiple electronic subsystems, each having one or more heat generating IT components disposed therein requiring cooling. "Electronic subsystem" refers to any sub-housing, blade, book, drawer, node, compartment, etc., having one or more heat generating IT components disposed therein. Each electronic subsystem of an electronic rack may be movable or fixed relative to the electronic rack. Accordingly, each rack-mounted electronic drawer or slot of a multi-drawer electronic rack unit, such as server blades of a server blade system, are an example of a subsystem of an electronic rack that needs to be cooled.

Here, "electronic component" refers to any heat generating electronic component of, for example, a computer system or other electronics system, subsystem or unit requiring cooling. In one embodiment, an electronic component may include one or more integrated circuits and/or other electronic devices to be cooled, including one or more power supplies, fan units, processors, and memory controllers. Further, an electronic component may also refer to components within the electronic components, such as a voltage regulator, voltage converter, fan controller, etc.

As used herein, a "fan system" may refer to any cooling mechanism characterized as described herein through which air can circulate; and includes, one or more fan units coupled to one or more power supplies to provide cooling air to reduce the operating temperature of the IT components within the electronic rack. Further, "a data center" refers to a computer installation system containing one or more electronic racks that need to be cooled. As a specific example, a data center may include one or more rows of rack-mounted computing units, such as server units. Further, for example, the combination of electronic racks, power supplies, power supply fans, electronic rack fans, and the enclosure are considered to be the basic elements of a data center cooling system design.

In one embodiment, main elements of a data center cooling system include one or more electronic racks with IT components, cabling, power, fans, and cooling enclosed by an enclosure of the electronic rack for the purpose of efficiently cooling the IT components. The cooling is achieved by the fan system having one or more fan units coupled to a power supply, where each of the fan units includes a fan controller (not shown) to receive an intermediate voltage that bypasses a voltage regulator of the power supply that provides power to a fan of the fan, which then provides cooling air to the IT components and reduces the operating temperature of the electronic rack. The electronic rack is located inside of a pod cluster (also referred to as a data center system or data center unit) along with several other electronic racks.

Referring now to FIG. 1, according to one embodiment, electronic rack 100 includes a housing structure, such as a room or a container, to house rows of electronic racks of IT components, equipment, or instruments, such as, for example, computer servers that provide data services to a variety of clients. In this embodiment, electronic rack 100 may be arranged in rows of one or more other electronic racks in a data center unit. Electronic rack 100 having a stack of IT components therein that can slide in and out of a rack slot of the data center unit. Typically, an electronic rack includes a front panel and a back panel operating as front and back doors, which can be opened by an operator to perform management or maintenance actions. Typically, the front panel can be used to access the IT components, such as network connectors of the IT components, while the back panel is used to access one or more cooling fans mounted therein configured to blow cool air into an airspace between the IT components for the purpose of heat exchange. An IT personnel or operator can walk into pod aisle 112 to access the back panels of the electronic racks.

In one embodiment, electronic rack 100 includes a housing 110 (also referred to as a rack housing, rack enclosure, or rack container) to house rack power supply 120 and IT components, such as IT components 105A and 105B, in a stack. Further, electronic rack 100 includes a front panel 101 and a back panel 102, which may operate as a front door or front window and a back door or back window, respectively. The rack housing 110 is configured to house a stack of IT components 105A-105B and rack power supply 120. An IT component may operate as a server to provide data services to a variety of clients over a network. For example, an IT component may operate as a Web or cloud server, a storage server, an application server, a backend server, or any other appliance devices In one embodiment, the stack of IT components 105A-105B are positioned between front panel 101 and back panel 102 to form a front rack aisle 111 (e.g., first rack aisle) and a back rack aisle 112 (e.g., second rack aisle). In addition, rack power supply 120 having at least one or more power supplies is disposed within at least one rack housing (i.e., electronic subsystem) of electronic rack 100. In one embodiment, electronic rack 100 may include battery 130 (e.g., backup power supply) to provide uninterrupted power supply to the electronic components of electronic rack 100. For example, battery 130 may be a rechargeable battery. Battery 130 provides an alternate form of energy storage system for electronic rack 100 storing energy and converting it to electrical power, which provides a way of ensuring uninterrupted electrical power to the electronic components of electronic rack 100 if there is a power outage from the main power supply.

According to one embodiment, electronic rack 100 further includes one or more fans 115-116, in this example, mounted on a side of IT components 105A-105B to direct cool air to flow through the airspace between IT components 105A-105B to reduce the operating temperature of IT components 105A-105B. While flowing through the airspace between IT components 105A-105B, the cool air exchanges with the heat generated from IT components 105A-105B to transform or become hot or warm air in rack aisle 112. That is, due to the heat exchange, the airflow flowing into rack aisle 112 has a temperature higher than the temperature of the airflow received in rack aisle 111. Such a heat exchange of an airflow leads to a temperature reduction of IT components 105A-105B.

In one embodiment, rack power supply 120 is coupled to one or more fans 115-116 (also referred to as fan units) mounted on the side of IT components 105A-105B to provide cooling air to reduce the heat generated by IT components 105A-105B. For example, fans 115-116 push cool air towards rear rack aisle 112 from air drawn from front rack aisle 111, where the cooling air flows through IT components 105A-105B to reduce the heat generated by the IT components 105A-105B. In one embodiment, in addition to one or more fan units, each of the fan units includes a fan controller (not shown) that receives an intermediate voltage generated by a voltage converter (not shown) of rack power supply 120 to provide power to a fan coil (not shown) of the fan unit.

According to some embodiments, rack power supply 120 is configured to provide a regulated voltage to IT components 105A-105B of electronic rack 100 via a power bus or an interconnect (not shown). The regulated voltage provided to the IT components 105A-105B is generated by a voltage regulator (not shown) of rack power supply 120. Accordingly, rack power supply 120 may provide a regulated voltage to power the IT components 105A-105B, and an intermediate voltage that bypasses its voltage regulator to provide power to fan units 115-116. One of the advantages of having the intermediate voltage of the power supply bypass the DC regulation state of the power supply (i.e., bypassing the voltage regulator) and coupled to the fan units of the electronic racks is that this reduces the power loss introduced from the regulated circuitry of the power supply without impacting the efficiency of the fan units. Accordingly, this advantage provides a net result of a gain in electrical efficiency of power delivered to the fan units. Note that the one or more different voltages supplied by rack power supply 120 are discussed in further detail in FIGS. 2-3.

Also note that the configuration as shown in FIG. 1 is described for the purpose of illustration only. Other configurations may also be applied. For example, a front side or front panel may be configured as a back side or back panel, or vice versa in another configuration. Further, fan units 115-116 may be mounted on the other side of the IT components, as long as they are coupled to the intermediate voltage of the power supply and can direct the cool air travelling through the airspace between the IT components.

Figure 2:
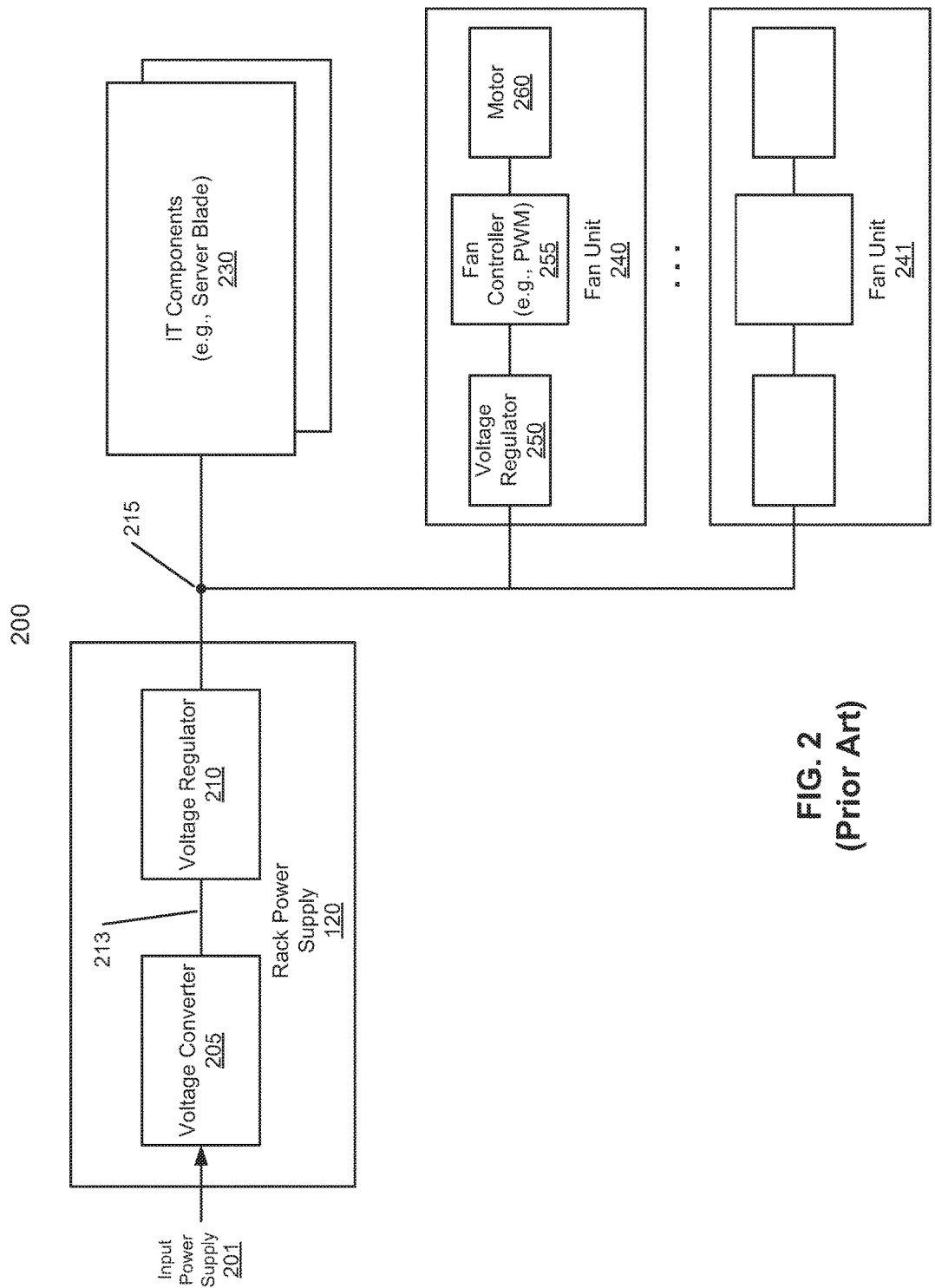
FIG. 2 is a block diagram illustrating a conventional electronic rack in a data center system according to one embodiment of the invention.

FIG. 2 is a block diagram illustrating a conventional electronic rack in a data center system according to one embodiment of the invention. Further, FIG. 2 illustrates an exemplary circuit diagram of electronic rack system 200. Electronic rack system 200 includes rack power supply 120 coupled to IT components 230 and fan units 240-241. Typically, electronic rack system 200 includes rack power supply 120 that converts input power supply 201 into regulated voltage 215 (also referred to as a regulated low voltage DC power), where regulated voltage 215 is used to supply power to IT components 230 and fan units 240-241.

Conventionally, rack power supply 120 contains voltage converter 205 coupled to voltage regulator 210. In this example, rack power supply 120 receives input power supply 201 from a power source (e.g., a power distribution unit (PDU)), where input power supply 201 is coupled to voltage converter 205. Voltage converter 205 converts input power supply 201 into intermediate voltage 213 that is coupled to voltage regulator 210. Then, voltage regulator 210 regulates intermediate voltage 213 to generate regulated voltage 215, which is supplied to IT components 230 and fan units 240-241. However, when rack power supply 120 converts input power supply 201 into regulated voltage 215, the regulated voltage 215 incurs a power loss (e.g., around 1% loss) due to the DC regulation stage of voltage regulator 210. As such, this power loss creates an additional step to the electrical power conversion of the conventional electronic rack and to the power distribution to the fan units, which is not cost-efficient and impedes the overall efficiency of the fan units (e.g., total power loss efficiency from an input power supply to a fan coil of a fan unit is roughly 16%). Note that the one or more components of each fan unit and power supply are discussed in detail in FIG. 3.

Figure 3:
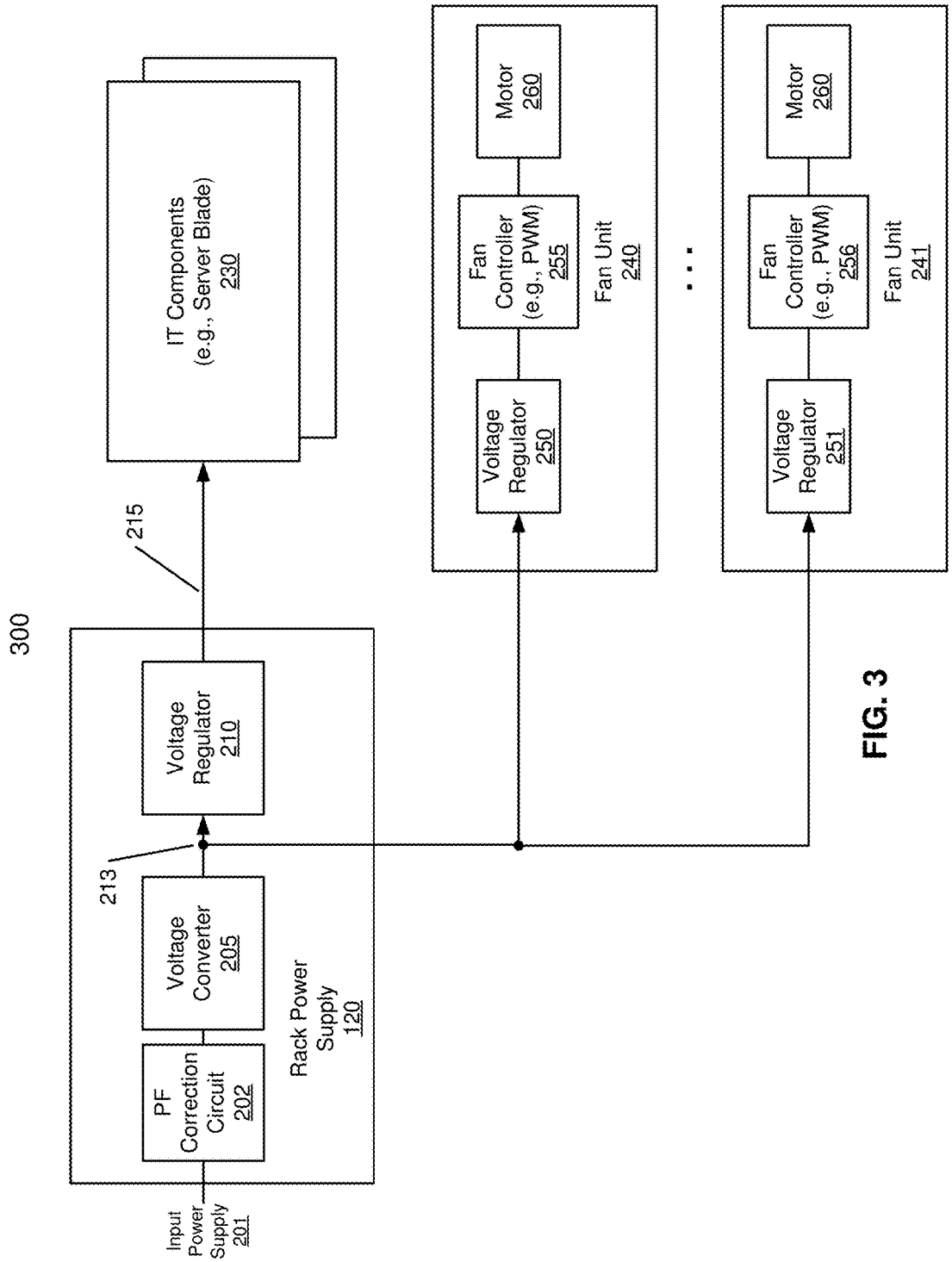
FIG. 3 is a block diagram illustrating a power supply system of an electronic rack in a data center system according to one embodiment of the invention.

FIG. 3 is a block diagram illustrating a power supply system of an electronic rack in a data center system according to one embodiment of the invention. Electronic rack system 300 includes rack power supply 120 coupled to IT components 230. Rack power supply 120 converts input power supply 201 into intermediate voltage 213 (also referred to as a non-regulated voltage power) and regulated voltage 215 (also referred to as a regulated low voltage DC power). The input power supply 201 may be a part of a data center power supply that provides power to a number of electronic racks. The input power supply 201 may provide alternating current (AC) power to rack power supply 300. According to one embodiment, intermediate voltage 213 is used to supply power to fan units 240-241, and regulated voltage 215 is used to supply power to IT components 230 (e.g., server blades).

In one embodiment, rack power supply 120 includes at least one of voltage converter 205 and voltage regulator 210. Voltage converter 205 may be an electrical power converter that converts the voltage of an electrical power source (e.g., PDU). For example, voltage converter 205 may convert an input power supply of 100-250 volts AC (VAC) or direct current (DC) from a power source, such as a PDU, to an unregulated intermediate voltage, e.g., 12 volts DC (VDC) or 48 VDC. Note that a voltage converter may be configured to other desired input to output power ratio as required by the electronic rack of the data center. Thus, voltage converter 205 may be an AC-to-DC (AC/DC) converter. Alternatively, input power supply 201 may provide a DC voltage, where voltage converter 205 may be a DC-to-DC (DC/DC) converter.

A voltage converter is an electric power converter which changes the voltage of an electrical power source. It may be combined with other components to create a power supply. AC voltage conversion uses a transformer. Conversion from one DC voltage to another requires electronic circuitry (electromechanical equipment was required before the development of semiconductor electronics).

Voltage regulator 210 may be an electrical power regulator that generates a relatively constant DC output voltage (e.g., VDC) and contains circuits that keep the output voltage on a supplied load (e.g., IT components 230) at a regulated value. Voltage regulator 210 may supply power to one or more IT components (e.g., IT components 230) of electronic rack 300, and may receive signals indicating one or more power states or operating conditions of the one or more IT components powered by voltage regulator 210. For example, voltage converter 210 may regulate an unregulated intermediate voltage and generate an output regulated voltage, e.g., 12V DC, to supply one or more IT components of the electronic rack A voltage regulator is designed to automatically maintain a constant voltage level. A voltage regulator may be a simple "feed-forward" design or may include negative feedback control loops. It may use an electromechanical mechanism, or electronic components. Depending on the design, it may be used to regulate one or more AC or DC voltages. Electronic voltage regulators are found in devices such as computer power supplies where they stabilize the DC voltages used by the processor and other elements. In automobile alternators and central power station generator plants, voltage regulators control the output of the plant. In an electric power distribution system, voltage regulators may be installed at a substation or along distribution lines so that all customers receive steady voltage independent of how much power is drawn from the line.

According to one embodiment, rack power supply 120 further includes a power factor correction unit or circuit 202 to receive the input voltage from input power supply 201 to perform a power factor correction operation and to provide the power-factor corrected input voltage to voltage converter 205.

In electrical engineering, the power factor of an AC electrical power system is defined as the ratio of the real power flowing to the load to the apparent power in the circuit, and is a dimensionless number in the closed interval of −1 to 1. A power factor of less than one means that the voltage and current waveforms are not in phase, reducing the instantaneous product of the two waveforms (V×I). Real power is the capacity of the circuit for performing work in a particular time. Apparent power is the product of the current and voltage of the circuit. Due to energy stored in the load and returned to the source, or due to a non-linear load that distorts the wave shape of the current drawn from the source, the apparent power will be greater than the real power.

In an electric power system, a load with a low power factor draws more current than a load with a high power factor for the same amount of useful power transferred. The higher currents increase the energy lost in the distribution system, and require larger wires and other equipment. Because of the costs of larger equipment and wasted energy, electrical utilities will usually charge a higher cost to industrial or commercial customers where there is a low power factor. Linear loads with low power factor (such as induction motors) can be corrected with a passive network of capacitors or inductors. Non-linear loads, such as rectifiers, distort the current drawn from the system. In such cases, active or passive power factor correction may be used to counteract the distortion and raise the power factor. The devices for correction of the power factor may be at a central substation, spread out over a distribution system, or built into power-consuming equipment.

According to one embodiment, a power source (not shown) supplies input power supply 201 to voltage converter 205 of rack power supply 120. Voltage converter 205 converts input power supply 201 into intermediate voltage 213, which is supplied to voltage regulator 210 and fan units 240-241. Voltage regulator 210 regulates intermediate voltage 213 to generate regulated voltage 215, which is supplied to IT components 230.

In one embodiment, fan units 240-241 receive intermediate voltage 213 and provide cooling air to reduce the operating temperature of IT components 230. By receiving intermediate voltage 213 without going through voltage regulator 210, the electrical efficiency of power supplied to fan units 240-241 is improved. As such, this removes an additional step of electrical power conversion to the power distribution to the fan units, which is cost-efficient and improves the overall efficiency of the fan units (e.g., total power loss efficiency from an input power supply to a fan coil of a fan unit is reduced to roughly 15% to 12% depending on the value of intermediate voltage). Note that with a higher DC bus voltage (e.g., 48 V DC) rather than a lower DC bus voltage (e.g., 12 V DC), electronic rack 300 may further yield a lowered total power loss of power distribution from the power supply to the fan units which the net result is an increased electrical efficiency of power delivered to the fan units.

In one embodiment, fan unit 240 includes, but is not limited to, voltage regulator 250, fan controller 255, and motor 260. Fan unit 240 may be any fan that is used for providing cool air to the one or more IT components, and refers to any fan that can draw cooler air into an electronic rack from the outside, expel warm air from inside, or move air across a heated component to cool a particular component. According to some embodiments, fan units 240-241 may be fans that use a duty cycle in a pulse-width modulated (PWM) signal for control. However, note that in other embodiments, the fans may also be ordinary direct current fans.

According to one embodiment, voltage regulator 250 (also referred to as a fan voltage regulator) is coupled to fan controller 255 (e.g., PWM controller), and fan controller 255 is coupled to motor 260 (also referred to as a fan motor, a fan coil, etc.). To improve the overall power efficiency of fan unit 240, for example, voltage regulator 250 receives intermediate voltage 213 and provides a regulated voltage to fan controller 255. Then, fan controller 255 supplies a controlled voltage to motor 260, which generates cooling air to reduce the heat generated by IT components 230. Note that since fan controller 255 is configured to regulate fan speeds (also referred to as fan power) across a wide range of speed values, a DC bus input variation as delivered by the non-regulated intermediate voltage 213 (rather than regulated voltage 215) is not going to decrease efficiency or overall fan performance.

In one embodiment, fan controller 255 is an integrated circuit (IC) motor controller that provides an electronically commutated configuration that modulates a bus input power supply to the power that is used to energize a fan motor (e.g., motor 260). In one embodiment, fan controller 255 generates a controlled voltage, which may be an output power command (e.g., a PWM signal) to drive motor 260. For example, the amount of energy applied to motor 260 is controlled by fan controller 255 through the use of the PWM command of the output signal to the motor 260. Additionally, for example, a duty cycle of the PWM signal may be controlled by fan controller 255, where various factors determine the duty cycle such as a target speed setting, a measured rotational speed, and the supplied voltage of each fan unit. Note that the closed-loop fan speed control and speed/power commands are discussed in further detail in FIG. 5. Also, note that rack power supply 120 may only include voltage converter 205 according to other embodiments in order to provide cost efficiency.

Figure 4:
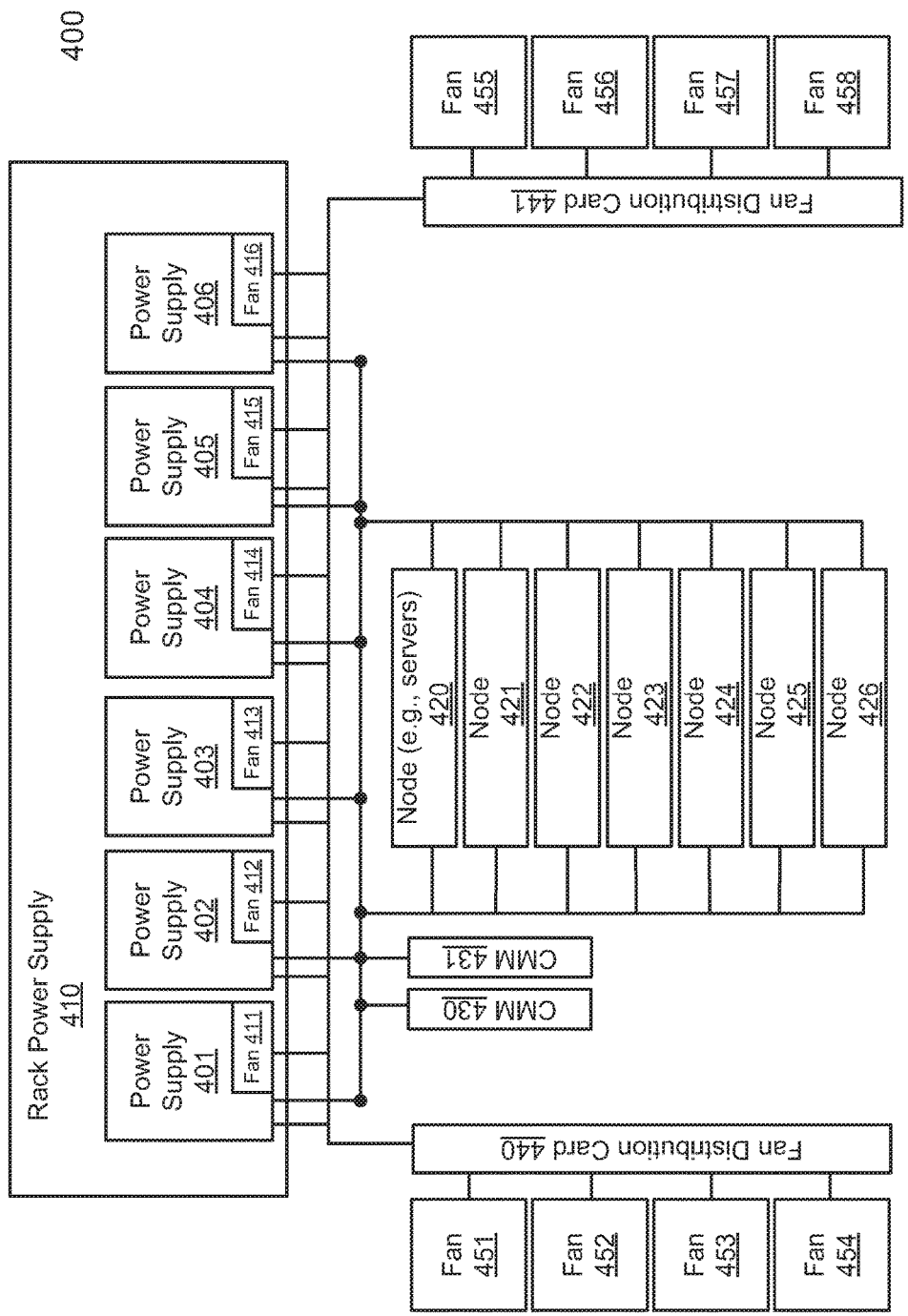
FIG. 4 is a block diagram illustrating an electronic rack in a data center system according to one embodiment of the invention.

FIG. 4 is a block diagram illustrating an electronic rack in a data center system according to one embodiment of the invention. For example, electronic rack system 400 may be implemented as part of system 100 of FIG. 1. In one embodiment, electronic rack system 400 includes, but is not limited to, rack power supply 410 communicatively coupled with fan units 451-458, nodes 420-426, chassis management modules (CMMs) 430-431, and fan distribution cards 440-441. According to one embodiment, rack power supply 410 includes, but is not limited to, power supplies 401-406. Further, each power supply 401-406 respectively includes at least one power supply fan 411-416.

In one embodiment, rack power supply 410 includes one or more power supply units 401-406 which connect power from a PDU, a power cable whip, or a busway to the IT components of electronic rack 400. For example, rack power supply 410 may be an alternating current (AC) power supply that rectifies AC to DC power, and/or a direct current (DC) power supply that receives DC power from a PDU, a power cable whip, or a busway, and does not need to rectify power. Further, rack power supply 410 transforms (or step downs) the input voltage of the power that is received to 12 V DC (or 48 V DC) before it is distributed to the IT components (e.g., nodes 420-426) of electronic rack 400.

Further, power supplies 401-406 may be coupled to one or more power buses (also referred to as power domains) within electronic rack 400, which may distribute non-regulated intermediate voltage power to fan units 451-458 and regulate voltage power (e.g., 12 V DC) to the IT components, such as compute nodes, I/O modules, and ancillary components. In one embodiment, fan units 451-458 receive intermediate voltage to provide cooling air to reduce the operating temperature of IT components 230, rather than the regulated voltage that is supplied to nodes 420-426. As such, the electrical efficiency of the power supplied to fan units 451-458 is improved by avoiding the power loss that is associated with the regulated voltage that is supplied to nodes 420-426.

In one embodiment, power supplies 401-406 also provide fault isolation for electronic rack 400. For example, if there is a power supply failure (even an over voltage fault) on power supply 401, the other redundant power supplies (e.g., power supply 402-406) continue to power the electronic components of electronic rack 400. According to one embodiment, electronic rack 400 manages fan units 451-458 based on node configuration within the rack by using fan distribution cards or blades 440-441. As a result, electronic rack 400 may increase the speed of certain fan units to cool potential hot spots within certain nodes, and use lower speeds for other fan units where appropriate to be efficient.

Accordingly, with the increased number of IT components that are housed in an electronic rack, all of which produce varying amounts of heat, the electronic rack (e.g., electronic rack 400) can become increasingly heated. This heat can cause multiple issues in the electronic rack because the IT components can overheat and eventually shut down. As such, electronic rack 400 provides a fan system having one or more fan units 451-458 to provide cooling air to reduce the heat generated by the IT components of electronic rack 400, including keeping the other electronic subsystems of the rack cool (e.g., enclosures, cabling, etc.). For example, fan units 451-458 may be responsible for cooling nodes 420-428 and CMMs 430-431, and accordingly power supplies 401-406 are cooled by their own respective internal fans (e.g. fans 411-416) inside the power supplies. Note that depending on the size of the electronic rack, there might be more or less fan units required to cool the IT components disposed within the electronic rack.

In one embodiment, nodes 420-426 of electronic rack 400 support a combination of IT components for computing, storage, and networking resources to meet the demands of one or more clients. Each node of nodes 420-426 includes a rack housing of one or more IT components, such as integrated server blades, storage systems, and networking systems. According to one embodiment, electronic rack 400 also includes one or more chassis management modules (CMMs) 430-431 to monitor and control electronic components disposed within electronic rack 400. For example, each CMM may monitor and manage the power usage of all the main power components of the electronic rack, which provides total visibility over power consumption and efficiency.

Figure 5:
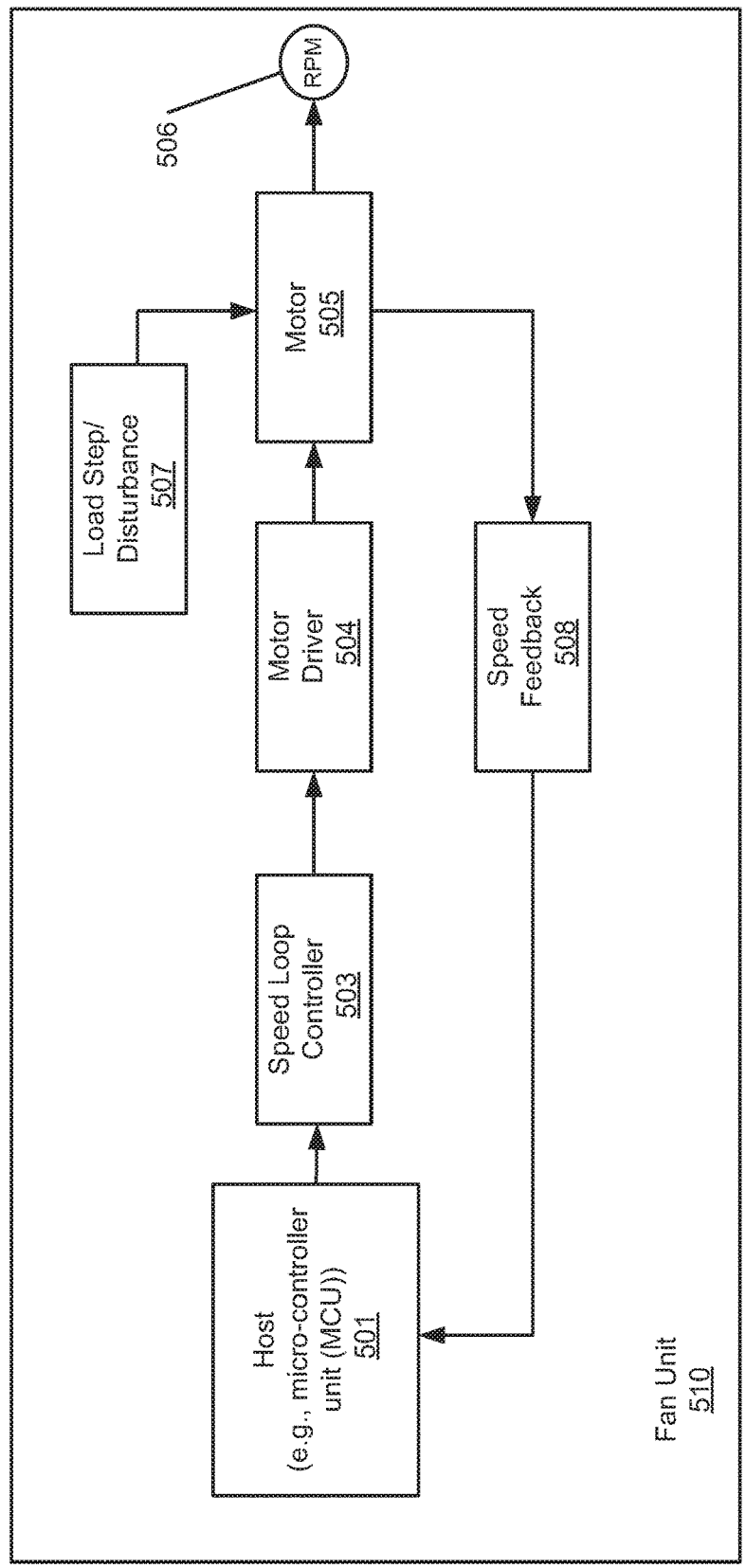
FIG. 5 is a block diagram illustrating a fan system in a data center according to one embodiment of the invention.

FIG. 5 is a block diagram illustrating a fan system in an electronic rack of a data center according to one embodiment of the invention. For example, fan system 500 illustrates an exemplary circuit diagram of a closed-loop speed control for fan unit 510. Fan system 500 can be performed by processing logic which may be implemented in software, firmware, hardware, or any combination thereof. In one embodiment, fan unit 510 includes, but is not limited to, host 501, speed loop controller 503, motor driver 504, motor 505, measured revolutions per minute (RPM) 506, load step/disturbance 507, and speed feedback 508. The closed-loop speed control of fan unit 510 provides an improved method to control fan speed because it drives the fan to a target fan speed by measuring a feedback signal from the fan. Accordingly, fan unit 510 then automatically adjusts the drive setting until the target speed is reached.

Referring now to FIG. 5 according to one embodiment, fan unit 510 may be coupled to a power supply (e.g., rack power supply 120) in order to provide cooling air the reduce the operating temperature of one or more IT components of an electronic rack. Accordingly, fan unit 510 may be configured to receive an intermediate voltage from the power supply, in which the intermediate voltage is a non-regulated input power supply that has not gone through a voltage regulator of the power supply, to provide power to motor 505.

According to one embodiment, to improve the fan efficiency of fan unit 510 using the closed-loop speed control (as illustrated in fan system 500), it is essential that the fan speed of fan unit 510 is precisely controlled to react to changes in temperature (e.g., increased heat generated by one or more IT components in an electronic rack), keeping the ambient and electronic components' temperatures at safe, acceptable levels. In addition to controlling the temperature, fan unit 510 needs to operate as quietly as possible, which means being able to run at low speed and then quickly transition to higher speeds as the temperature rises, which may be measured by a temperature sensor (not shown) in the electronic rack.

In one embodiment, speed feedback 508 is coupled with motor 505 to provide a "feedback" signal from motor 505 to host 501 (also referred to as a micro-controller unit/chip, a fan control algorithm, etc.). Host 501 may include a fan control logic and one or more speed commands. According to one embodiment, host 501 monitors one or more temperatures, determines what the target speed should be, and sends the target speed value to the speed loop controller 503.

For example, the feedback signal 508 is coupled with host 501 to provide an input speed command to speed loop controller 503, which is configured for controlling the motor speed of fan unit 510. According to one embodiment, host 501 may be implemented in software on a microcontroller, may be embedded in the motor driver itself (e.g., motor driver 504), or may be configured as a standalone component. Host 501 provides one or more speed commands as controlled algorithm signals that can be either linear or table-driven for discrete fan speed steps, where the table-driven algorithm supports a non-linear temperature to fan speed relationship and can avoid operating at undesirable fan speeds that might cause acoustic resonance.

Continuing with the above example, speed loop controller 503 receives the input speed command based on the signal (e.g., a PWM signal) from the speed feedback 508, and generates a power command to motor driver 504 to adjust (i.e., increase or decrease the value of the output signal to motor 505) the fan speed of motor 505. Motor driver 504 generates a motor driver output that drives the speed settings of motor 505, where the motor driver output may either be a variable DC voltage (linear) or a PWM signal. For example, the PWM output provides a wider fan speed range to motor 505 and thus may more accurately control RPMs 506 of fan unit 510, which improves efficiency and costs. As a result, motor 505 is readjusted based on the new speed command associated with the speed feedback signal and load step/disturbance 507. Accordingly, after readjusting motor 505, the closed-loop continues to provide a constant speed feedback signal to host 501. As a result, host 501 receives an updated speed input that converts a square wave (i.e., a duty cycle of the PWM signal) from motor 505 to an updated fan speed and then repeats the functions as stated above (i.e., a closed-loop speed fan control).

In one embodiment, the speed feedback signal from speed feedback 508 is an output power command that is associated with a PWM signal. In some embodiments, one or more sensors (not shown) in fan unit 510 may be used to take measurements to determine a target speed setting, a measured rotation speed (e.g., RPM 506), and a supplied voltage (e.g., intermediate voltage 213), where these measurements are used to generate the speed feedback that is used to adjust the speed commands of fan unit 510. Note that fan system 500 may be implemented with the fan units as illustrated in FIG. 3.

Also note that the cooling techniques described above can be applied to a variety of different types of data centers, such as, for example, traditional colocation data centers and greenfield data centers. A colocation data center is a type of data center where equipment, space, and bandwidth are available for rental to retail customers. Colocation facilities provide space, power, cooling, and physical security for the server, storage, and networking equipment of other firms, and connect them to a variety of telecommunications and network service providers with a minimum of cost and complexity. A greenfield data center refers to a data center that is built and configured in a location where none exists before. The techniques described above can also be applied to or work in conjunction with a performance optimized data center (POD), or portable on-demand or container data center, where racks of servers are housed in one or more individual containers, modular rooms, or modular housings.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Note that while an electronic rack of a data center is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems which have fewer components or perhaps more components may also be used with embodiments of the invention.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:
   a plurality of information technology (IT) components arranged in a stack, wherein the electronic rack is one of a plurality of electronic racks of a data center, and wherein each of the IT components comprises a computer server having at least a processor and a memory;
   a rack power supply having a voltage converter and a voltage regulator, the rack power supply to receive an input voltage from a power source, wherein the voltage converter is to convert the input voltage into an intermediate voltage, wherein the voltage regulator is to regulate the intermediate voltage to generate a regulated voltage to be supplied to the plurality of the IT components; and
   a fan system having one or more fan units coupled to the rack power supply to provide cooling air to reduce an operating temperature of the IT components, wherein each of the fan units is to receive the intermediate voltage without going through the voltage regulator and to provide power to a fan of the fan unit, wherein each fan unit if mounted on a backend of one of the IT components.

2. The electronic rack of claim 1, wherein the intermediate voltage is a non-regulated voltage due to the non-regulated voltage bypassing the voltage regulator of the rack power supply.

3. The electronic rack of claim 1, wherein the intermediate voltage is ranging from 49 to 60 volts.

4. The electronic rack of claim 1, wherein the voltage converter is an alternating current-to-direct current (AC/DC) converter.

5. The electronic rack of claim 4, wherein the input voltage is an AC voltage ranging from 110-250 volts AC, and wherein the voltage converter is to convert the AC voltage to approximate 48 volts DC.

6. The electronic rack of claim 1, further comprising a power factor correction circuit to receive the input voltage, to perform a power factor correction on the input voltage, and to provide the input voltage with a power factor corrected to the voltage converter.

7. The electronic rack of claim 1, wherein the regulated voltage is approximately 48 volts.

8. The electronic rack of claim 1, wherein each fan unit comprises:
   a motor; and a fan controller to receive the intermediate voltage, provide the intermediate voltage to the motor, and provide a command signal to control the motor.

9. The electronic rack of claim 8, wherein the command signal is in a form of pulse-width modulated (PWM) pulses, and wherein the fan controller is to control a duty cycle of the PWM pulses to control a speed of the motor.

10. The electronic rack of claim 1, wherein the computer server of each of the IT components is to provide data services to a plurality of clients.

11. A data center system, comprising:
a data center power supply coupled to a power source; and
a plurality of electronic racks coupled to the data center power supply, wherein each of the electronic racks includes
a plurality of information technology (IT) components arranged in a stack, wherein each of the IT components comprises a computer server having at least a processor and a memory,
a rack power supply having a voltage converter and a voltage regulator, the rack power supply to receive an input voltage from the data center power supply, wherein the voltage converter is to convert the input voltage into an intermediate voltage, wherein the voltage regulator is to regulate the intermediate voltage to generate a regulated voltage to be supplied to the plurality of the IT components, and
a fan system having one or more fan units coupled to the rack power supply to provide cooling air to reduce an operating temperature of the IT components, wherein each of the fan units is to receive the intermediate voltage without going through the voltage regulator and to provide power to a fan of the fan unit, wherein each fan unit if mounted on a backend of one of the IT components.

12. The data center system of claim 11, wherein the intermediate voltage is a non-regulated voltage due to the non-regulated voltage bypassing the voltage regulator of the rack power supply.

13. The data center system of claim 11, wherein the intermediate voltage is ranging from 49 to 60 volts.

14. The data center system of claim 11, wherein the voltage converter is an alternating current-to-direct current (AC/DC) converter.

15. The data center system of claim 14, wherein the input voltage is an AC voltage ranging from 110-250 volts AC, and wherein the voltage converter is to convert the AC voltage to approximate 48 volts DC.

16. The data center system of claim 11, wherein each electronic rack further comprises a power factor correction circuit to receive the input voltage, to perform a power factor correction on the input voltage, and to provide the input voltage with a power factor corrected to the voltage converter.

17. The data center system of claim 11, wherein the regulated voltage is approximately 48 volts.

18. The data center system of claim 11, wherein each fan unit comprises:
a motor; and
a fan controller to receive the intermediate voltage, provide the intermediate voltage to the motor, and provide a command signal to control the motor.

19. The data center system of claim 18, wherein the command signal is in a form of pulse-width modulated (PWM) pulses, and wherein the fan controller is to control a duty cycle of the PWM pulses to control a speed of the motor.

20. The data center system of claim 11, wherein the computer server of each of the IT components is to provide data services to a plurality of clients.

* * * * *